US012525462B2

(12) United States Patent
Posseme et al.

(10) Patent No.: US 12,525,462 B2
(45) Date of Patent: Jan. 13, 2026

(54) METHOD FOR ETCHING A THREE-DIMENSIONAL DIELECTRIC LAYER

(71) Applicant: COMMISSARIAT A L'ENERGIE ATOMIQUE ET AUX ENERGIES ALTERNATIVES, Paris (FR)

(72) Inventors: Nicolas Posseme, Grenoble (FR); Valentin Bacquie, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 892 days.

(21) Appl. No.: 17/652,312

(22) Filed: Feb. 24, 2022

(65) Prior Publication Data
US 2022/0270888 A1 Aug. 25, 2022

(30) Foreign Application Priority Data
Feb. 25, 2021 (FR) .................................... 21 01865

(51) Int. Cl.
*H01L 21/311* (2006.01)
*H01L 21/02* (2006.01)
*H10D 30/01* (2025.01)

(52) U.S. Cl.
CPC .... *H01L 21/31116* (2013.01); *H01L 21/0214* (2013.01); *H01L 21/02164* (2013.01);
(Continued)

(58) Field of Classification Search
CPC ........... H01L 21/31116; H01L 21/0214; H01L 21/02164; H01L 21/02238;
(Continued)

(56) References Cited

U.S. PATENT DOCUMENTS 9,947,768 B2 4/2018 Posseme
10,573,529 B2 2/2020 Posseme et al.
(Continued)

FOREIGN PATENT DOCUMENTS

CN 110120332 A * 8/2019 .......... C23C 16/401
EP 3 107 125 B1 1/2020
(Continued)

OTHER PUBLICATIONS

French Preliminary Search Report issued Nov. 10, 2021 in French Application 21 01865 filed on Feb. 25, 2021, 9 pages (with English Translation of Categories of Cited Documents & Written Opinion).

*Primary Examiner* — Jeff W Natalini
*Assistant Examiner* — Rose Keagy
(74) *Attorney, Agent, or Firm* — Oblon, McClelland, Maier & Neustadt, L.L.P.

(57) ABSTRACT

A method for etching a dielectric layer covering a top and a flank of a three-dimensional structure, this method including a first etching of the dielectric layer, including a first fluorine based compound, a second compound taken from SiwCl (2w+2) and SiwF(2w+2), oxygen, this first etching being carried out to form a first protective layer on the top and form a second protective layer on the dielectric layer, a second etching configured to remove the second protective layer while retaining a portion of the first protective layer, the first and second etchings being repeated until removing the dielectric layer located on the flank of the structure. The second etching can be carried out by hydrogen-based plasma.

15 Claims, 8 Drawing Sheets

(52) U.S. Cl.
CPC .. *H01L 21/02238* (2013.01); *H01L 21/02252* (2013.01); *H10D 30/024* (2025.01); *H01L 21/31144* (2013.01)

(58) Field of Classification Search
CPC ......... H01L 21/02252; H01L 29/66795; H01L 21/31144; Y02E 60/36
See application file for complete search history.

(56) References Cited

U.S. PATENT DOCUMENTS

| | | | |
|---|---|---|---|
| 2006/0183285 A1* | 8/2006 | Yoshida | H01L 29/40114 438/257 |
| 2015/0228683 A1* | 8/2015 | Kato | H01L 27/14636 438/69 |
| 2017/0338280 A1* | 11/2017 | Frost | H10B 63/84 |
| 2019/0067444 A1* | 2/2019 | Ching | H01L 21/02532 |
| 2019/0214266 A1* | 7/2019 | Posseme | H01L 21/31116 |

FOREIGN PATENT DOCUMENTS

| | | |
|---|---|---|
| EP | 3 506 336 B1 | 11/2020 |
| FR | 3 076 068 B1 | 11/2019 |

\* cited by examiner

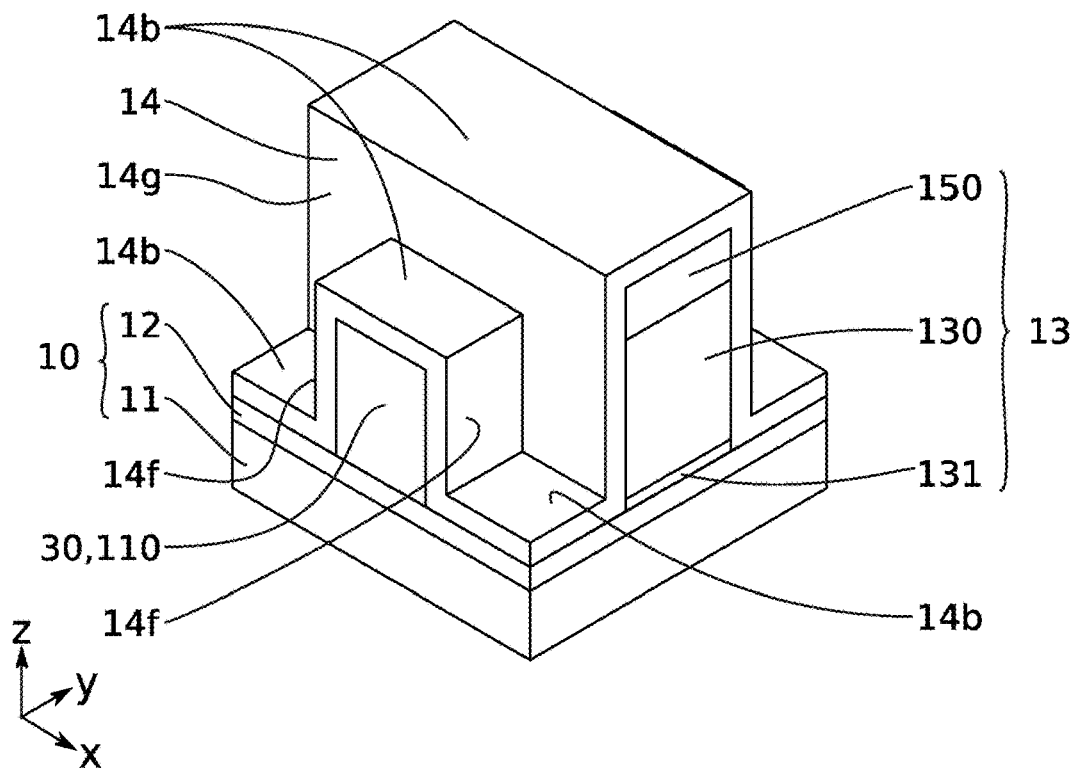
PRIOR ART    FIG. 1
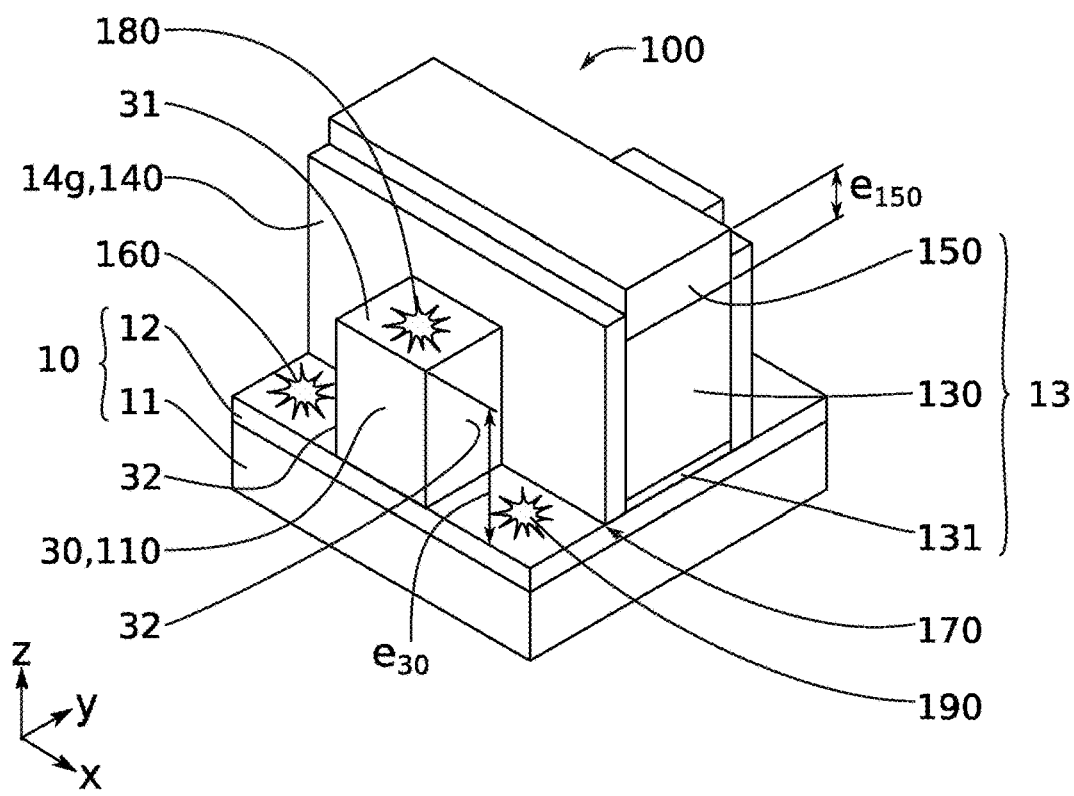
PRIOR ART    FIG. 2

METHOD FOR ETCHING A THREE-DIMENSIONAL DIELECTRIC LAYER

TECHNICAL FIELD

The present invention generally relates to the etching of layers on microelectronic structures, in particular three-dimensional (3D) structures.

It finds a particularly advantageous application in the production of FinFET type transistors, that is to say field effect transistors (FET) whose conduction channel comprises a vertical lamella of a semiconductor material, qualified by the term "fin".

PRIOR ART

To improve the electrical performance of transistors, three-dimensional (3D) architectures have been developed. This is for example the case of transistor architectures based on nanowires and FinFET architectures.

An important issue in the manufacturing methods of transistors having a 3D architecture is the control of the etching of the spacers of these transistors.

By way of example, a FinFET type transistor 100 is illustrated in FIGS. 1 and 2, respectively before etching the spacers and after etching the spacers. In this 3D architecture, the conduction channel 110 consists of a vertical lamella of semiconductor material, typically silicon. The lamella forming the channel 110 is surrounded on three sides by the gate pattern 13. The lamella crosses right through the gate pattern 13 and is extended to form fins 30 on either side of the gate pattern 13. These Fins thus constitute three-dimensional (3D) structures.

To form the spacers 140 on the flanks of the gate pattern 13, a conformal deposition of a layer 14 of a dielectric material is first carried out on the gate pattern 13 and the Fin 30 (FIG. 1).

As illustrated in FIG. 2, the etching of the dielectric layer 14 is ideally configured to remove the basal portions 14b and the Fin lateral portions 14f while retaining only the lateral gate portions 14g forming the spacers 140. Thus, all the other layer portions 14, in particular those covering the Fin 30, whether they are perpendicular or parallel to the basal plane XY of the substrate 10, must be etched completely. This must be done without leaving 190 residue and without damaging 160 the layers underlying the dielectric layer 14, typically without damaging 180 the top 31 of the Fins 30 and/or without damaging the upper face of the BOX 12 (acronym for "buried oxide"). Moreover, it is important that the etching be anisotropic along z so as to avoid 170 the formation of feet at the base of the spacers 140.

Document EP 3506336 B1 provides a method for etching the dielectric layer allowing to form such spacers by repeating several sequences of oxidation and etching steps. This method aims at consuming the dielectric layer on the flanks of the Fin while protecting the top of the Fin.

In practice, however, the implementation of this etching method is not optimal. The top of the Fin remains impacted. A shrinkage of material commonly called "recess" is typically observed at the top of the Fin to a depth of 1 to 2 nm. The etching depth precision and/or the etching stop can therefore be improved.

There is therefore a need consisting in proposing a solution for completely etching with great precision a dielectric layer located on the faces of a 3D structure while avoiding damage to this 3D structure.

An object of the present invention is to overcome the limitations of the known solutions.

In the particular and non-limiting context of FinFET type transistors, a purpose of the present invention consists in proposing a solution for etching on the Fins the dielectric layer intended to form spacers on the flanks of the gate, while avoiding, or even eliminating the dielectric layer residues on either side of the Fins as well as the consumption of layers underlying the dielectric layer such as the semiconductive layer forming the Fin.

Another object of the present invention is to propose a method for etching a dielectric layer allowing better control of the etching stop at the top of three-dimensional structures such as Fins.

The other objects, features and advantages of the present invention will become apparent when examining the following description and the accompanying drawings. It is understood that other advantages may be incorporated.

SUMMARY

To achieve this purpose, according to one embodiment, provision is made of a method for etching a dielectric layer covering at least one top and one flank of a three-dimensional structure preferably based on a semiconductor material.

The method comprises a plurality of sequences each comprising at least the following successive steps:
 a first etching of the dielectric layer, by plasma, using a chemistry comprising:
  at least a first fluorine (F)-based compound originating from the dissociation of at least one compound taken from the fluorocarbon compounds $C_xF_z$ or $C_xH_yF_z$, x, y and z being non-zero integers, and
  at least a second compound taken from $Si_wCl_{(2w+2)}$ and $Si_wF_{(2w+2)}$ w being a non-zero integer,
  oxygen (O).
 said first etching being carried out in such a way as to:
  generate an ion bombardment directed mainly in a direction parallel to said flank,
  regulate the amount of at least a first compound to consume all of said first fluorine-based compound during this first etching so as to interrupt the first etching before consumption of the entire thickness of the dielectric layer located on the flank and after having consumed the entire thickness of the dielectric layer located on the top,
  forming a first oxide-based protective layer on the top of the three-dimensional structure and forming a second oxide-based protective layer on the dielectric layer located on the flank, a thickness e50a of the first protective layer being greater than a thickness e60a of the second protective layer,
 a second etching configured to completely remove the second protective layer while retaining a portion of thickness e50b of the first protective layer.

This sequence of first and second etchings is repeated until completely removing the dielectric layer located on the flank of the structure.

Advantageously, the second etching is carried out by hydrogen ($H_2$)-based plasma.

Thus, the present invention proposes an effective solution for etching entirely and with great precision the dielectric layer on the top and the flanks of a 3D structure while avoiding damage to this 3D structure.

Typically, etching the dielectric layer in this sequence of steps is such that it is possible to control the stop on an underlying silicon layer on an atomic scale.

Indeed, the chemistry used during the first etching, combining fluorinated or fluorocarbon species and at least one silicon-based gas, allows to efficiently etch the dielectric layer, with high selectivity with respect to the semiconductor material of the 3D structure. Moreover, this etching is interrupted when all the fluorinated species is consumed, before etching the semiconductor material of the 3D structure. The presence of oxygen in the plasma leads to the formation of a protective layer whose thickness is greater on the semiconductor material of the 3D structure than on the dielectric layer.

The second etching allows to remove the protective layer on the dielectric layer, while retaining part of this protective layer on the semiconductor material. During the first etching of the following sequence, the semiconductor material will therefore be protected by the residue of the first protective layer, which will prevent the etching of the latter, while the dielectric layer will no longer be protected by the second protective layer. The dielectric layer, exposed, will therefore easily be etched.

By repeating this sequence of steps, the dielectric layer is quickly etched while consuming extremely little, or even without consuming the semiconductor material of the 3D structure.

In the context of the development of the present invention, it has been observed that the second etching as disclosed by document EP 3506336 B1 typically results in amorphising the semiconductor material at the top of the 3D structure. The implementation of the second etching according to document EP 3506336 B1 is based on the use of a plasma based on fuorocarbon species. It appeared during the development of the present invention that amorphising the top of the 3D structure is due to the ion bombardment of these fuorocarbon species through the oxide-based protective layer.

To limit or eliminate the damage by amorphising the top of the 3D structure, a first alternative solution to that proposed in the present invention has been considered within the context of the development of the present invention. This alternative solution consists in reducing the energy of the ions based on fuorocarbon species during the second etching. This alternative solution was not adopted, because it was observed, in the context of the development of the present invention, that this solution leads during said second etching to a degradation of the dimensional control of the spacers, also commonly called control of the CD or simply CD (acronym for "Critical Dimension").

To limit or eliminate the damage by amorphising the top of the 3D structure, a second alternative solution to that proposed in the present invention has been considered within the context of the development of the present invention. This second alternative solution consists in increasing the thickness of the first protective layer, typically by extending the duration of the first etching. This second alternative solution was not retained either, because it was observed, within the context of the development of the present invention, that this solution also leads to a degradation of the CD of the spacers during the second etching. In particular, by extending the duration of the first etching, a layer based on the second compound is formed on the substantially vertical surfaces of the dielectric layer. This layer is then eliminated during the second etching, which laterally consumes the dielectric layer. The CD is then degraded.

The present invention is based on the contrary on a different principle, which consists in using light ions, in particular hydrogen-based ions, to etch the first and second protective layers during the second etching. Hydrogen-based ions have the advantage of not amorphising the top made of semiconductor material. The top of the 3D structure is thus preserved from a subsequent recess.

In particular, to form the plasma used during the second etching, no fluorine-based compound is injected into the reactor. The source of hydrogen can typically be dihydrogen (H2) or ammonia (NH3). Optionally, only chemically inert elements (for example argon or helium) can be introduced into the reactor to promote the dissociation of the hydrogen source. It is preferable to avoid using heavy ions to form the hydrogen-based plasma, the ions being considered heavy when their atomic mass is greater than or equal to 40.

Advantageously, at least one additional effect is obtained through the use of hydrogen-based ions. During the etching of the second protective layer and/or after having etched the second protective layer, the hydrogen ions are also implanted in a part of the dielectric layer underlying the second protective layer. This has the effect of modifying the dielectric material of this part of the underlying dielectric layer. Under the conditions of the first etching, it is more difficult to form an oxide-based protective layer on the modified dielectric material. Thus, during the following sequence, the formation of the second protective layer on the part made of modified dielectric material is delayed. The thickness of the second protective layer is lower. The removal of this second protective layer by the next second etching is then faster. The implantation of hydrogen ions in the underlying dielectric layer is more efficient.

The modified dielectric material is further etched more easily during the following sequence, under the conditions of the first etching. The overall etch rate of the dielectric layer increases.

Unlike the known solutions, even optimised ones, the etching method according to the invention thus advantageously allows to significantly improve the protection of the top of the 3D structure while increasing the etch rate of the dielectric layer on the flanks of the 3D structure.

When the 3D structure is intended to form a FinFET type transistor, the present invention thus proposes an effective solution for etching the dielectric layer deposited on the Fins, while avoiding, or even eliminating, a recess of the layers underlying the dielectric layer, in particular at the top of the Fins.

Another aspect of the present invention relates to a method for producing a FinFET transistor surmounting a support substrate, the FinFET transistor comprising a gate pattern and at least one channel passing through the gate pattern and extending from a flank of the gate pattern to form at least one structure preferably made of a semiconductor material, said structure having a top and at least two flanks.

The method comprises:
  the deposition, preferably conformal deposition, of a dielectric layer covering the gate pattern and said structure,
  the etching of the dielectric layer by implementing the method according to any one of the embodiments of the etching method according to the invention, so as to completely remove the dielectric layer located on the structure formed by the channel.

Optionally, the method for producing a FinFET transistor may comprise at least any one of the following features taken alone or in combination:

According to an exemplary embodiment, the gate pattern comprises a gate and a hard mask covering a top of said gate, the dielectric layer being deposited on the hard mask, the hard mask having a thickness e150, greater than or equal to a thickness e30 of said structure, and preferably such that e150≥1.2*e30.

Thus, when the etching entirely consumes the dielectric layer located on the flanks of the structure, the entire height of the flanks of the gate remains covered by the dielectric layer. Consequently, the removal of the dielectric layer on the flanks of the Fin does not lead to the removal of this dielectric layer on the flanks of the gate. The dielectric layer remaining on the flanks of the gate forms the spacers of the FinFET transistor.

BRIEF DESCRIPTION OF FIGURES

The aims, objects, as well as the features and advantages of the invention will emerge better from the detailed description of embodiments of the latter which are illustrated by the following accompanying drawings wherein:

FIG. 1 schematically illustrates a FinFET type transistor in progress, before etching the spacers.

FIG. 2 schematically illustrates a FinFET type transistor in progress, after etching the spacers.

Figure 3A:
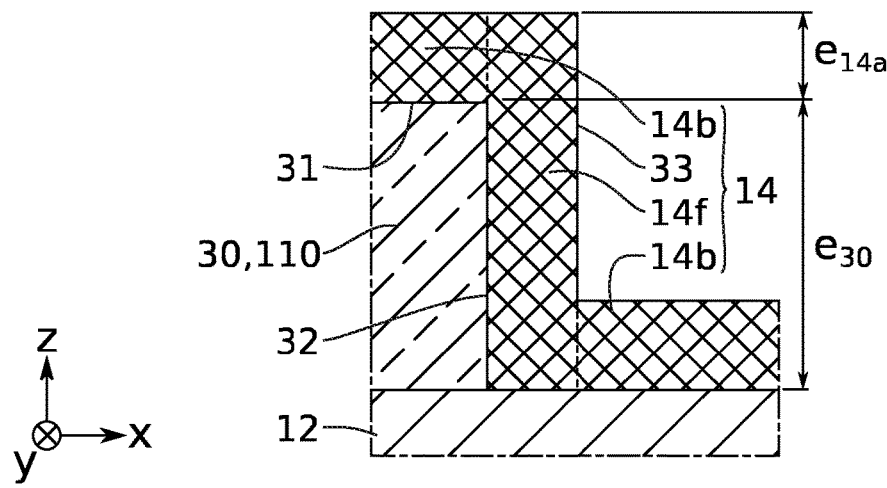
FIGS. 3A to 3J schematically illustrate steps of an etching method according to one embodiment of the present invention.

The drawings are given by way of examples and do not limit the invention. They constitute schematic principle representations intended to facilitate the understanding of the invention and are not necessarily scaled to practical applications. In particular, on the principle diagrams, the thicknesses of the various layers and portions, and the dimensions of the patterns are not representative of reality.

DETAILED DESCRIPTION

Before starting a detailed review of embodiments of the invention, optional features are set out below which may optionally be used in combination or alternatively:

According to one example, the second etching is configured to modify an upper portion of the dielectric layer located on the flank, by implantation of hydrogen-based species. This allows to slow down the formation of a second oxide-based protective layer during a first subsequent etching. This allows to increase the duration of a first subsequent etching. This allows to increase the thickness of the first protective layer formed during a first subsequent etching. This allows to consume a greater dielectric layer height during a first subsequent etching. Said upper portion of the dielectric layer located on the flank is also called the modified lateral portion below.

According to one example, the second oxide-based protective layer is formed on an upper portion of the dielectric layer located on the flank.

According to one example, the hydrogen-based plasma of the second etching comprises ions from H+, H2+, H3+.

According to one example, the plasma of the second etching is formed from dihydrogen (H2) or ammonia (NH3) and at least one species X promoting the dissociation of dihydrogen or ammonia, said at least one species X being taken from nitrogen, helium.

According to one example, the hydrogen-based plasma of the second etching is fluorine-free. Possibly, traces of fluorine from the first etching may unintentionally reside in this hydrogen-based plasma from the second etch. On the other hand, during the second etching, no fluorine-based compound is injected into the reactor. The chemistry of the second etching plasma therefore does not comprise any fluorine-based compound.

According to one example, the hydrogen-based plasma of the second etching is anisotropic along the direction (Z) parallel to the flank of the structure.

According to one example, the energy of the ions of the hydrogen-based plasma is less than 250 eV, and preferably less than 150 eV.

According to one example, the hydrogen-based plasma of the second etching has a bias voltage of less than 250 V, and preferably less than 150 V. This allows to limit or even avoid a phenomenon of sputtering of the first oxide-based protective layer.

According to one example, the method comprises a sequence of first and second initial etchings and at least one sequence of first and second subsequent etchings, and, during the repetition of said at least one sequence of first and second subsequent etchings, the first subsequent etching has a duration greater than that of the first initial etching. This allows to increase the thickness of the first protective layer formed during said first subsequent etching. This allows to consume a greater dielectric layer height during said first subsequent etching.

According to one example, the first etching is configured so that the first oxide-based protective layer formed has a thickness e50a greater than or equal to 5 nm.

According to one example, the second etching is configured so that the portion of the first protective layer retained has a thickness e50b greater than or equal to 2 nm.

According to one example, the method comprises a preliminary step of oxidation of the dielectric layer carried out before said sequence of steps, the preliminary oxidation step being intended to limit lateral etching of the dielectric layer during the first etching.

According to one example, the method comprises a preliminary step of depositing said dielectric layer on said structure. Preferably, the deposition of said dielectric layer is a conformal deposition.

According to an exemplary embodiment, the method comprises a preliminary step of etching the dielectric layer, carried out before said sequence of steps, the preliminary etching step being interrupted so as to retain a portion of the dielectric layer located on the top of the structure, preferably made of a semiconductor material. This step typically allows to etch a large portion of the dielectric layer. It allows to increase the speed of the method.

According to an exemplary embodiment, the preliminary step of etching the dielectric layer is based on a fluorocarbon chemistry (for example CxFy or CxHyFz).

In the remainder of the description, it is considered that fluorocarbon chemistries comprise in particular the fluorocarbon compounds (CxFz) and the hydrofluorocarbon compounds (CxHyFz).

According to an exemplary embodiment, said first fluorine (F)-based compound of the chemistry used for the first etching step comes, preferably entirely, from the chemistry used during said preliminary etching step.

Alternatively, at least part and optionally all of the first fluorine (F)-based compound of the chemistry used for the first etching step is supplied during the first etching step.

According to an exemplary embodiment, the first fluorine (F)-based compound comes from the dissociation of at least one compound taken from the fluorocarbon compounds (for example CxFz or CxHyFz), x, y and z being non-zero integers.

According to one example, the first and second etchings are carried out in the same reactor.

According to one example, the reactor is configured to form a plasma by inductive coupling.

According to one alternative example, the reactor is configured to form a plasma by inductive coupling.

The structure is made of a material different from that of the dielectric layer. According to an exemplary embodiment, the structure is made of a semiconductor material. According to one example, the structure forms a channel of a FinFET transistor.

According to an exemplary embodiment, the gate pattern comprises a gate and a hard mask surmounting said gate.

According to one example, the hard mask thickness is greater than or equal to the height of the structure forming the channel of a FinFET transistor.

According to one example, the hard mask has a thickness e150, such that e150≥e30, e30 being the height of the structure (30), and preferably e150≥1.2*e30.

According to an exemplary embodiment, the flank(s) of the 3D structure extend along a plane perpendicular (YZ) to a main plane (XY) along which the support substrate extends.

According to an exemplary embodiment, the top extends mainly in a plane parallel to the plane (XY) of the support substrate.

According to an exemplary embodiment, said 3D structure is formed by at least one block or one lamella of semiconductor material.

According to an exemplary embodiment, the dielectric layer is directly in contact with the structure made of a semiconductor material.

Preferably, the semiconductor material is silicon. The semiconductor material can alternatively be germanium (Ge) or silicon-germanium SiGe. The structure made of a semiconductor material can also be made of a succession of layers, each layer being for example taken from the following materials: silicon (Si), germanium (Ge), silicon-germanium (SiGe). Thus, for the production of nanowires, a succession of layers, each formed of Si or SiGe, may be provided.

According to one example, the dielectric material of the dielectric layer is taken from: SiN, Si3N4, SiCO, SiC, SiCN, SiOCN, SiCBN, SiOCH.

According to an exemplary embodiment, when the dielectric layer located on the side of the structure is entirely etched, a step of removing the first protective layer is then carried out.

Preferably, this removal of the first protective layer is carried out using a solution based on hydrofluoric acid (HF).

Except incompatibility, it is understood that all of the above optional features can be combined to form an embodiment which is not necessarily illustrated or described. Such an embodiment is obviously not excluded from the invention.

It is specified that, in the context of the present invention, the terms "on", "surmounts", "covers", "underlying", "opposite" and their equivalents do not necessarily mean "in contact with". Thus, for example, the deposition of a first layer on a second layer does not necessarily mean that the two layers are directly in contact with one another, but means that the first layer at least partially covers the second layer while being either directly in contact therewith, or while being separated therefrom by at least one other layer or at least one other element.

A layer can also be composed of several sub-layers of the same material or of different materials.

A substrate, a stack, a layer, "based" on a material A, is understood to mean a substrate, a stack, a layer comprising this material A only or this material A and possibly other materials, for example alloy elements and/or doping elements. Thus, a silicon-based layer means for example an Si, n-doped Si, p-doped Si, SiGe layer. A germanium-based layer means for example a Ge, n-doped Ge, p-doped Ge, SiGe layer.

The word "dielectric" describes a material whose electrical conductivity is low enough in the given application to serve as an insulator. In the present invention, a dielectric material preferably has a dielectric constant of less than 7. The modified dielectric material is said to be different from the unmodified dielectric material.

"Nature" of a material, means its chemical composition and/or its crystalline structure. Thus two layers can be of the same chemical composition but of different nature from a crystallographic point of view.

Several embodiments of the invention implementing successive steps of the manufacturing method are described below. Unless explicitly mentioned, the adjective "successive" does not necessarily imply, even if this is generally preferred, that the steps follow each other immediately, intermediate steps being able to separate them.

Moreover, the term "step" refers to performing part of the method, and may designate a set of sub-steps.

Moreover, the term "step" does not necessarily mean that the actions carried out during a step are simultaneous or immediately successive. Some actions of a first step can in particular be followed by actions related to a different step, and other actions of the first step can be repeated later. Thus, the term step does not necessarily mean actions which are unitary and inseparable in time and in the sequence of the phases of the method.

A preferably orthonormal reference frame, comprising the axes x, y, z is shown in the appended figures. When only one reference frame is represented on the same sheet of figures, this reference frame applies to all the figures of this sheet.

In the present patent application, the thickness of a layer is taken along a direction normal to the main extension plane of the layer. Thus, a layer typically has a thickness along z. The relative terms "on", "surmounts", "under", "underlying" refer to positions taken in the direction z.

The terms "vertical", "vertically" refer to a direction along z. The terms "horizontal", "horizontally" refer to a direction in the plane xy. The term "lateral" refers to a plane xz or yz. Thus, the lateral flanks of the gate extend parallel to a plane yz. The lateral flanks of the Fin structure extend parallel to a plane xz. Unless explicitly mentioned, the thickness, the height and the depth are measured according to z.

An element located "directly above" or "in line with" another element means that these two elements are both located on the same line perpendicular to a plane wherein extends mainly a lower or upper face of a substrate, that is to say on the same line oriented vertically in the figures.

In the context of the present invention, the term "three-dimensional structure" denotes a structure that protrudes above an underlying layer, such as a supporting substrate.

In the context of the present invention, a non-limiting but particularly advantageous example of a 3D structure is a lamella (also referred to as a fin) forming the extension of a FinFET transistor channel, as illustrated in FIG. 2. As mentioned above, the formation of the spacers flanking the gate pattern of this FinFET transistor requires precise etching of the parts of the dielectric layer covering the Fin.

FIGS. 3A to 3J illustrate an embodiment of the method for etching the dielectric layer 14 according to the invention. According to this non-limiting embodiment, provision is made of an initial structure in the shape of Fin 30 of a FinFET transistor. For the sake of clarity, only the Fin 30 of the FinFET transistor is reproduced in FIGS. 3A to 3J, in transverse section along a plane xz. Only one flank 32 of the Fin 30 is shown. The same steps and features apply to the other flanks of the Fin 30 perpendicular to the basal plane xy. It is understood that this Fin 30 is preferably adjacent to a gate pattern 13 comprising in a known manner a gate 130, a hard mask 150 and optionally a layer 131 with a high dielectric constant called "high k", as illustrated for example in FIG. 1.

All the features, steps and technical advantages that will be described later also apply to embodiments wherein the dielectric layer 14 surmounts a different three-dimensional structure of a Fin of a FinFET transistor. For example, they apply to structures forming nanowires and in particular stacked nanowires.

The Fin 30 is here supported by a substrate typically comprising an upper oxide-based part 12. The height e30 of the Fin 30 is referenced in FIG. 3A. For example, the height e30 of the Fin, measured in the direction Z from the upper face 120 of the upper part 12 of the substrate, is comprised between a few nanometres and a few tens of nanometres. Preferably, e30 is comprised between 10 and 200 nanometres and even more preferably, e30 is comprised between 32 and 150 nm and even more preferably.

The upper part 12 of the substrate can typically correspond to a layer of buried oxide BOX originating from a substrate of the silicon-on-insulator SOI type. Other substrates, for example made of a bulk semiconductor material, can alternatively be used. In particular, the upper part 12 is not necessarily based on oxide. The Fin 30 and the upper part 12 of the substrate are covered by a dielectric layer 14 comprising basal portions 14b and one or more lateral portions 14f. The basal portions 14b cover the top 31 of the Fin 30 and the upper face 120 of the upper part 12 of the substrate. The lateral portion 14f covers the flank 32 of the Fin 30.

Preferably, this dielectric layer 14 is a conformal layer.

In this example related to the FinFET transistors, this dielectric layer 14 is intended to form spacers on the flanks of the gate 130. This dielectric layer 14 is then formed of materials having a low dielectric constant. This dielectric layer 14 may or may not be porous. It is for example formed of one of the following materials: SiCO, SiC, SiCN, SiOCN or SiCBN, or a silicon nitride (SixNy, x and y being integers), typically SiN.

Once deposited, this dielectric layer 14 has for example a thickness e14a comprised between 4 and 50 nanometres, preferably between 4 and 30 nanometres and preferably between 8 and 12 nanometres. The thickness e14a is measured along the direction Z. It is referenced in FIG. 3A.

This dielectric layer 14 is for example formed by one of the following techniques: plasma enhanced chemical vapour deposition (PECVD), low pressure chemical vapour deposition (LPCVD), plasma enhanced atomic layer deposition (PEALD).

From the structure illustrated in FIG. 3A, several steps will be implemented with the aim of completely removing the dielectric layer 14 on the top 31 and on the flanks 32 of the Fin 30, without leaving any dielectric layer residues and without damaging the Fin 30 and the upper part 20 of the substrate.

Figure 3B:
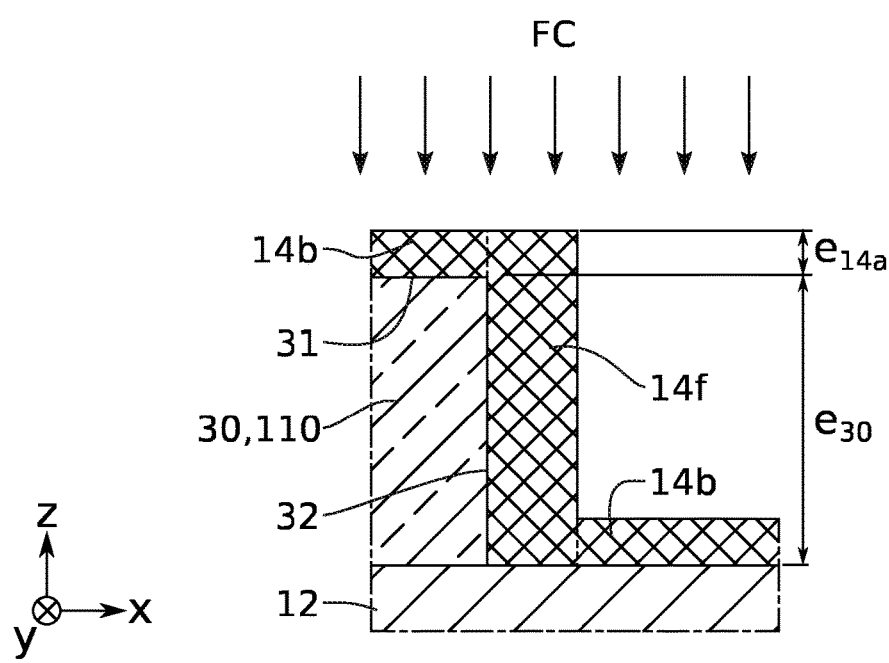

FIG. 3B illustrates an optional step during which only part of the thickness of the dielectric layer 14 is removed on the zones parallel to the plane XY of the substrate 10. This removal step mainly comprises an anisotropic etching directed along z. This anisotropic etching allows to increase the speed of the method before the subsequent steps which will allow very precise etching.

Typically, during this preliminary etching step, more than 70% and preferably more than 80% and even more preferably more than 90% of the initial thickness e14a of the dielectric layer 14 is etched.

Typically, after the etching, the dielectric layer 14 has a residual thickness e14b greater than 2 nm, preferably greater than 3 nm and preferably greater than 4 nm. Typically, the residual thickness e14b is comprised between 2 and 3 nm, so as to avoid damage to the underlying layers during this preliminary etching.

This etching step is for example carried out in an etching equipment of the inductively coupled plasma (ICP) reactor or capacitively coupled plasma (CCP) reactor type.

This plasma etching step is based on a chemistry comprising a fluorine (F)-based compound. Preferably, this chemistry comprises a fluorocarbon species, for example taken from the following species CxHyFz or CxHy, x, y and z being integers. This etching chemistry has the advantage of improving the anisotropy of the etching. This anisotropy allows not to etch the surfaces which are parallel to the preferred direction of etching. In the case of a FinFET transistor, the anisotropy of the etching allows not to etch the portions 14g of the dielectric layer 14 located on the flanks of the gate 130 and intended to form the spacers 140 of the transistor. The dimensional control, along y, of these spacers 140 directly impacting the performance of the transistor, it is important not to involuntarily etch the dielectric layer 14 on the flanks of the gate 130.

Preferably, the fluorocarbon chemistry also comprises at least one additional diluting or dissociating species such as argon (Ar), helium (He), nitrogen (N) or oxygen (O). The plasma can be continuous or pulsed.

According to one example, the conditions of this preliminary etching are as follows: the plasma is formed from CHF3 having a flow rate of 30 sccm, and from helium having a flow rate of 220 sccm. The power of the source is 300 W and the bias voltage is 65 V. The pressure is 5 milliTorr. The temperature of the support substrate is 60° C. The etching time is 20 s. This typically allows approximately 6 nm of SiN to be etched.

Figure 3C:
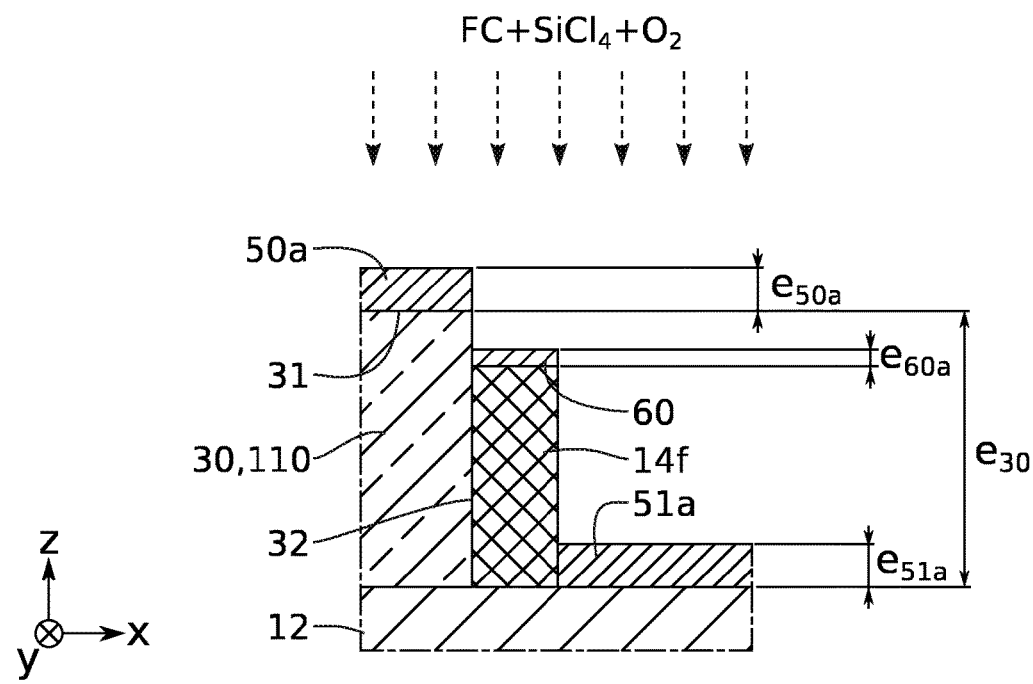
Figure 3D:
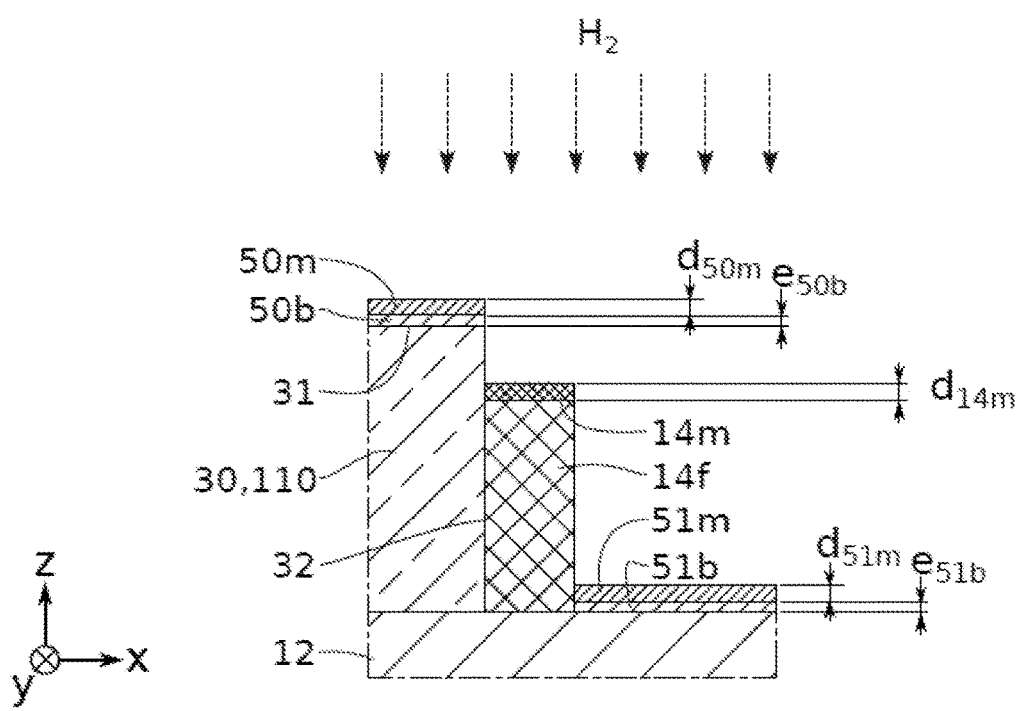
Figure 3E:
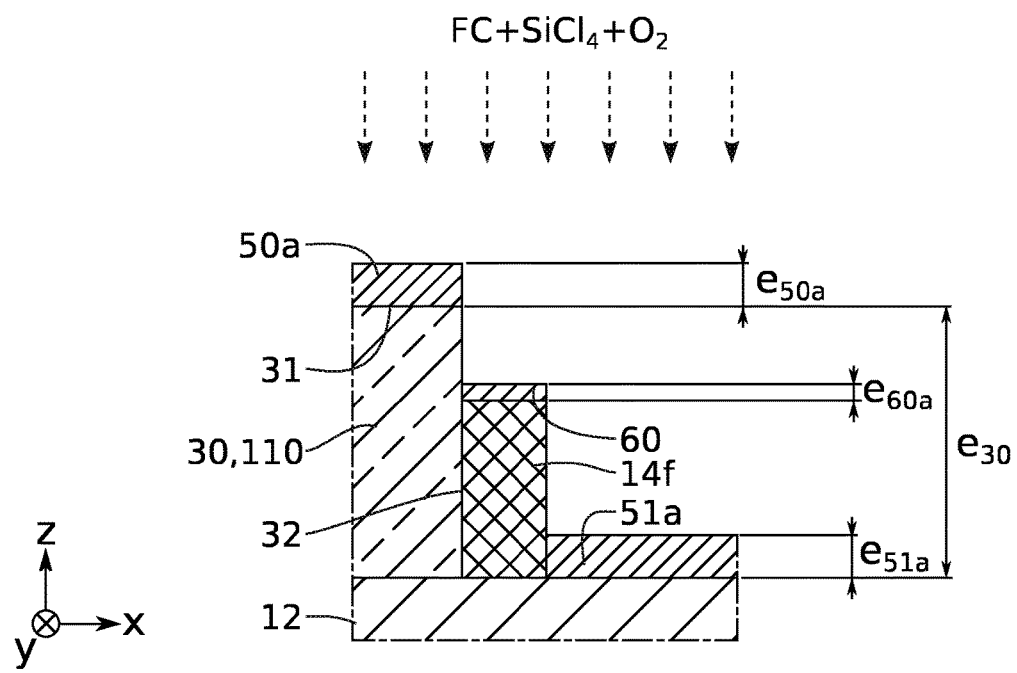
Figure 3F:
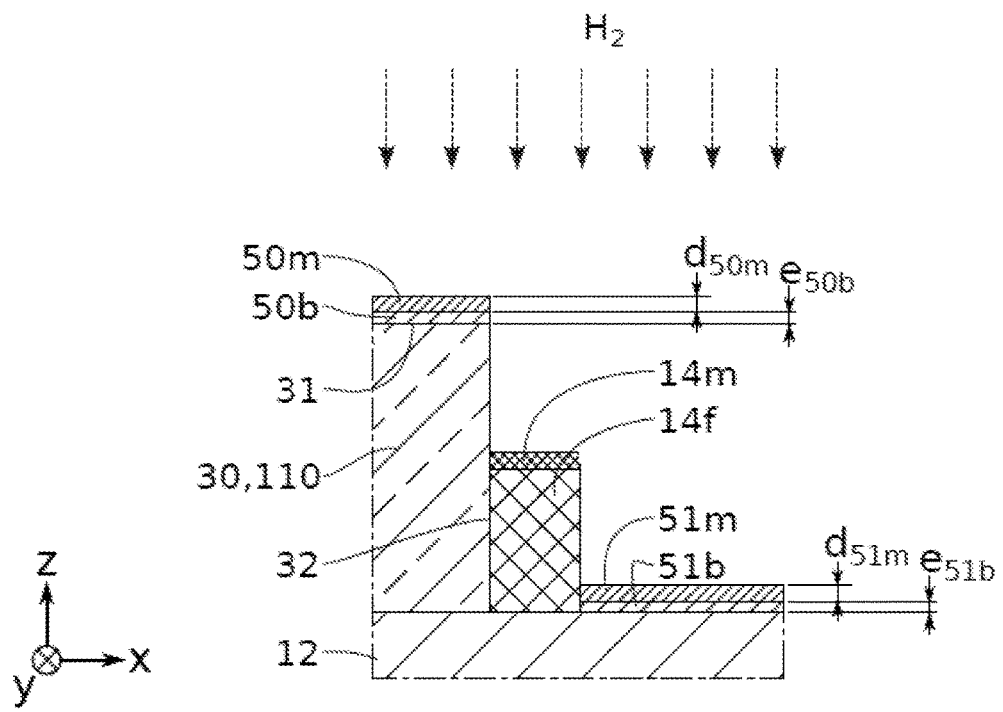
Figure 3G:
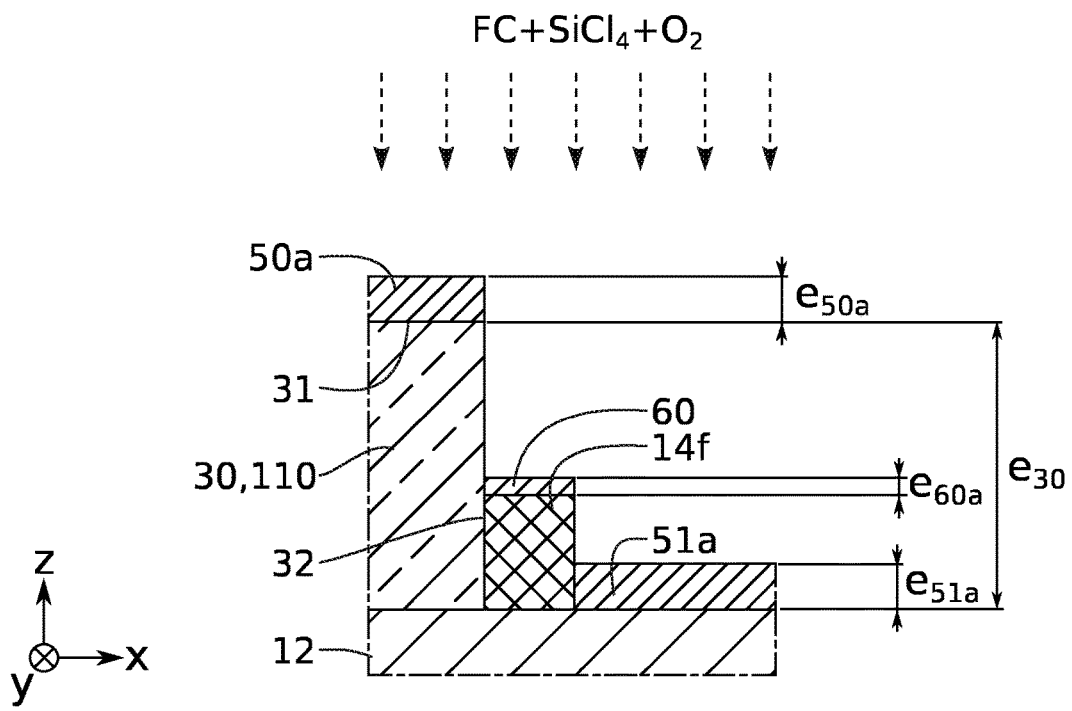
Figure 3H:
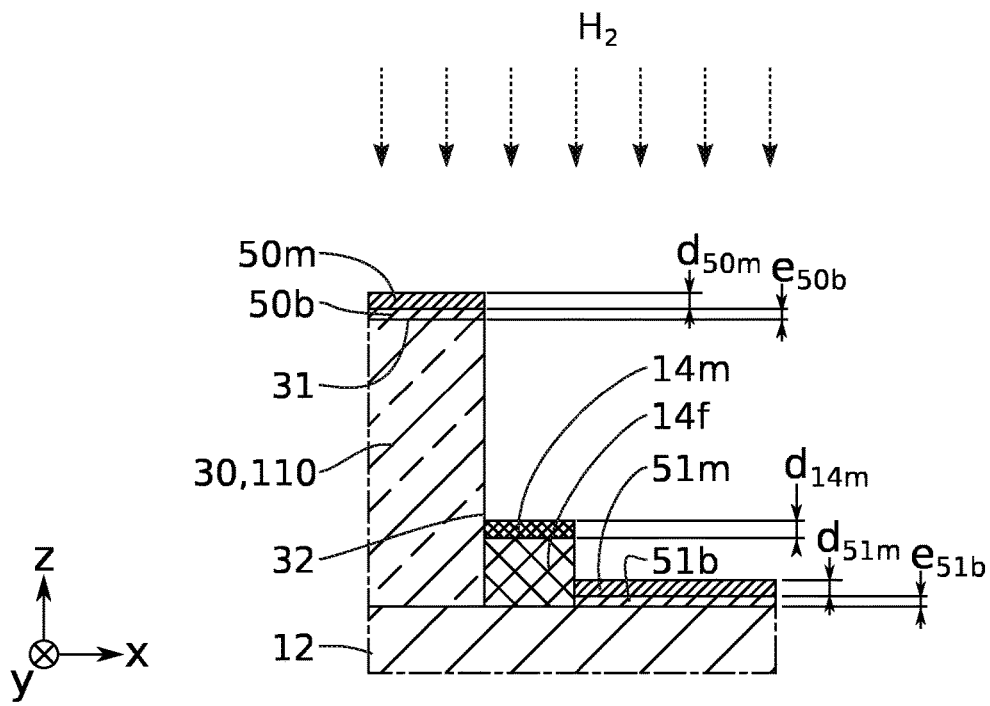
Figure 3I:
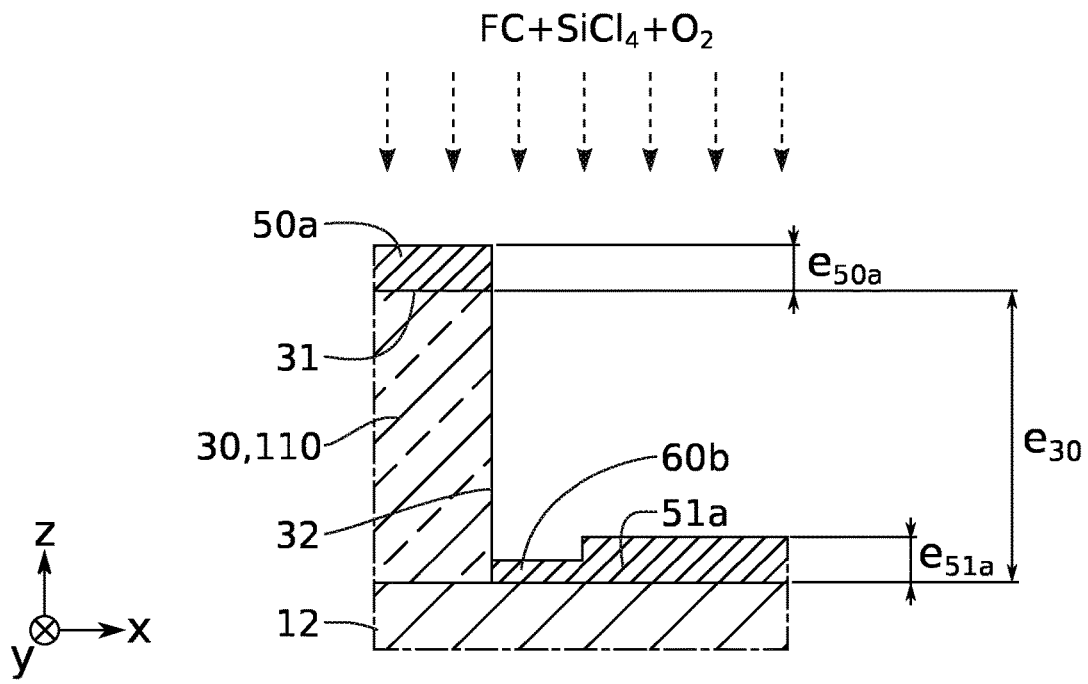

FIGS. 3C to 3I illustrate different steps of a sequence of steps which can be repeated until obtaining the result which is illustrated in FIG. 3I.

As illustrated in FIG. 3C, at the end of the preliminary etching, or after the deposition of the dielectric layer 14 (in the case where there is no preliminary etching), a first etching of the dielectric layer 14 is carried out.

This first etching is configured so as to etch the material of the dielectric layer 14 preferably to the material of the semiconductor material structure 30.

Moreover, this etching is configured in such a way as to:
- be interrupted before consuming the entire height along z of the lateral portion 14f of the dielectric layer, located on the flank 32 of the structure 30;
- form a first protective layer 50a on the top 31 of the semiconductor material structure 30 and to form a second protective layer 60 on an upper part of the lateral portion 14f of the dielectric layer located on the flank 32, the thickness e50a of the first protective layer 50a being greater than the thickness e60a of the second protective layer 60.

This first etching is preferably a plasma etching. This first etching of the dielectric layer 14 uses a chemistry comprising:
- at least a first fluorine (F)-based compound and
- at least a second compound taken from SiwCl(2w+2) and SiwF(2w+2) w being an integer,
- oxygen (O).

The first fluorine-based compound allows efficient etching of the dielectric layer 14 with good anisotropy.

The second compound allows to improve the selectivity of the etching of the dielectric layer with respect to the underlying layers, for example made of a semiconductor material or of silicon oxide ($SiO_2$).

The amount of the first fluorine-based compound is regulated so as to consume all the fluorine-based compounds, and therefore to interrupt the first etching before consuming the entire thickness (taken along the axis Z) of the lateral portion 14f of the dielectric layer 14 which is located on the flank 32.

According to a particularly advantageous embodiment, the first fluorine-based compound was entirely introduced during the preliminary etching step illustrated in FIG. 3B. The fluorine remaining at the end of this preliminary etching step is used during said first etching until it is completely consumed.

Alternatively, some or all of the fluorine-based compounds consumed during this first etching are introduced into the plasma reactor during this first etching.

The presence of oxygen in the chemistry of the plasma allows to form an oxide on the surface of the exposed layers. As long as there are compounds allowing the etching of the layers, typically the fluorine-based compound, the etching does not allow the formation of an oxide layer. On the other hand, once the compounds allowing the etching have been completely consumed, one or more oxide layers form on the exposed surfaces. These oxide layers grow or are deposited mainly along z, according to the preferred direction of bombardment of the ions from the plasma. The composition and/or the thickness of these oxide layers can vary depending on the nature of the surfaces on which they are formed. These oxide layers are typically based on $SiO_x$.

Thus, an oxide layer also called first protective layer 50a is formed on the top 31 of the structure 30. This first protective layer 50 is for example of the $Si_xO_yF_z$ type, if the structure 30 is based on silicon.

An oxide layer also called the second protective layer 60 is formed on the upper part of the lateral portion 14f of the dielectric layer located on the flank 32 of the Fin 30. This second protective layer 60 is for example of the $Si_xO_yN_wF_z$ type, if the dielectric layer 40 is based on SiN.

An oxide layer also called third protective layer 51a is formed on the upper face 120 of the upper part 12 of the substrate. This third protective layer 51a is for example of the $Si_xO_yF_z$ type, if the upper part 12 of the substrate is an insulating $Si_xO_y$-based layer.

The formation of the first protective layer 50a on the top 31 of the Fin is preferred due to the nature of the Fin, typically made of silicon.

It follows that the thickness e50a of the protective layer 50 formed on the top 31 of the structure 30 is greater than the thickness e60a formed on the lateral portion 14f located on the flank 32 of this structure 30.

Thus, the first protective layer 50a has a thickness e50a greater than that e60a of the second protective layer 60. Typically, e50a≥k1.e60a, with k1=1.5 and preferably k1=2 and preferably k1=3.

Advantageously, the protective layer 51a formed on the surface of the insulating layer 12 has a thickness e51a greater than that e60a of the protective layer 60 located on the lateral portion 14f. Typically, e51a≥k2.e60a, with k2=1.5 and preferably k2=2 and preferably k2=3.

Preferably, the chemistry used for this first etching also comprises dilution or dissociation species such as argon, helium or nitrogen. The plasma can be continuous or pulsed. In general, a pulsed plasma allows to limit the damage to the semiconductor material of the structure 30. The frequency of the pulsed plasma is preferably comprised between 200 Hz and 5 kHz, preferably of the order of 500 Hz, with an activation rate of 10% to 90% and typically 50%.

For example, during this first etching, a chemistry is used for the plasma comprising:
- $C_xH_yF_z$, for example $CH_3F$,
- $SiCl_4$ whose flow rate is comprised between 2 and 10 sccm and preferably between 2 and 5 sccm,
- oxygen,
- optionally a dissociation gas such as Ar, He or $N_2$.

Figure 4:
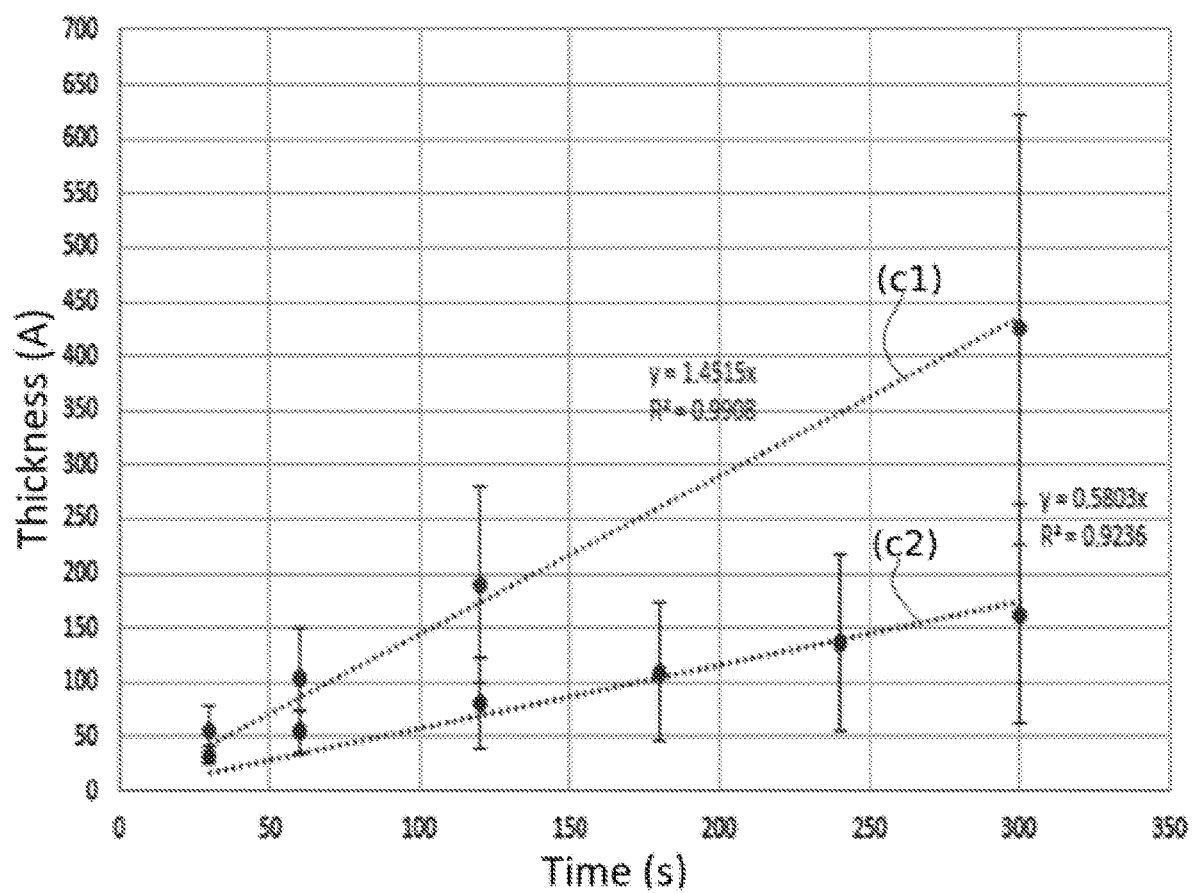
FIG. 4 is a graph illustrating the thickness of the deposited oxide-based protective layer as a function of time, for different SiCl4 and oxygen-based plasma conditions.

FIG. 4 illustrates the deposition thickness of the first protective layer as a function of time, for different $SiCl_4$ contents in the plasma. For a flow rate of $SiCl_4$ of 5 sccm, it is thus possible to deposit about 18 nm of oxide on polycrystalline silicon in 2 min, as illustrated by the curve (c1). The oxide deposition rate here is 8.71 nm/min.

For a flow rate of $SiCl_4$ of 2 sccm, it is thus possible to deposit around 7 nm of oxide on polycrystalline silicon in 2 min, as illustrated by the curve (c2). The oxide deposition rate here is 3.48 nm/min.

Figure 5:
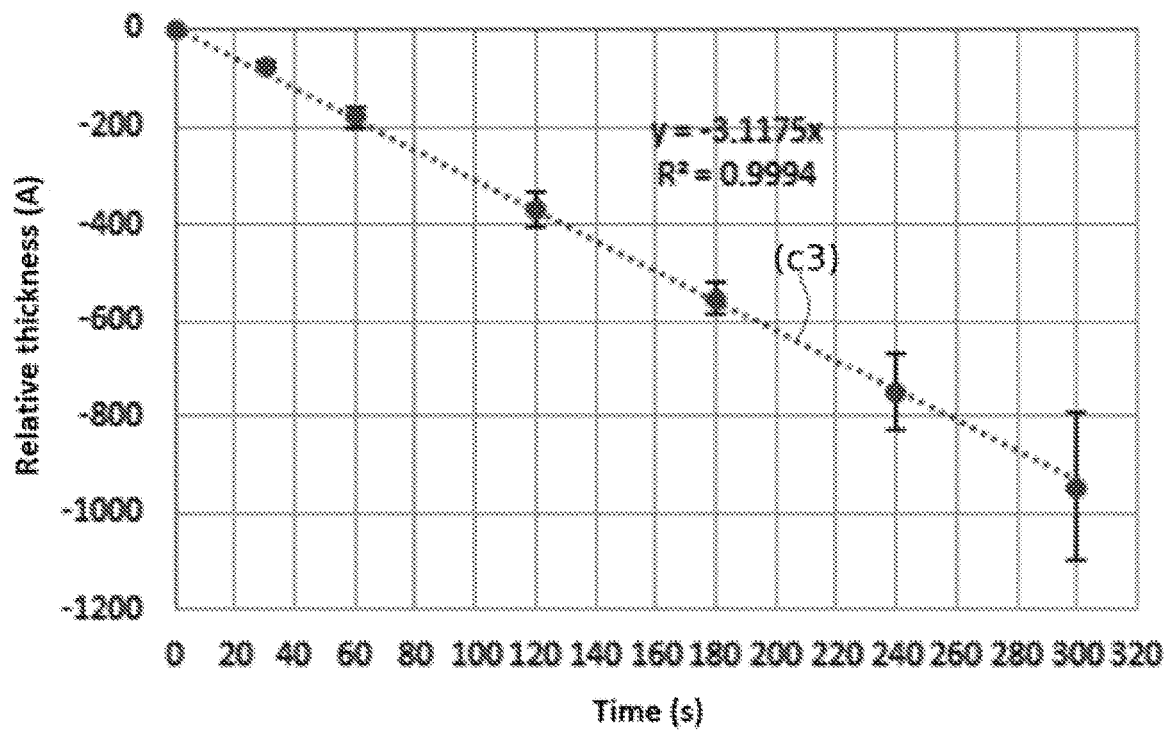
FIG. 5 is a graph illustrating the consumption of the dielectric layer as a function of time, for SiCl4 and oxygen-based plasma according to an embodiment of the present invention.

FIG. 5 illustrates the consumption of the dielectric layer 14 as a function of time. For a flow rate of $SiCl_4$ of 2 sccm, it is thus possible to consume approximately 40 nm of $Si_3N_4$ in 2 min, as illustrated by the curve (c3).

According to one example, the conditions of the first etching are as follows: the plasma is formed from a mixture of $CH_3F$ having a flow rate of 200 sccm, helium having a flow rate of 120 sccm, $SiCl_4$ having a flow rate of 2 sccm, and oxygen having a flow rate of 200 sccm. The power of the source is 400 W and the bias voltage is 250 V. The pressure is 90 milliTorr. The temperature of the support substrate is 60° C. The etching time is 30 s. This allows to form a first protective layer 4 to 5 nm thick on the top of the Fin while having consumed 5 to 7 nm of SiN from the lateral portion of the dielectric layer.

Typically, beyond a duration of 30 to 35 seconds, the lateral portion 14f of the SiN dielectric layer is no longer etched and the second oxide protective layer 60 begins to be deposited on the SiN. It can be deduced therefrom that the species actively participating in the etching, such as the fluorine (F)-based compound, are no longer present in sufficient amount beyond this duration. At the end of this duration, it is therefore possible to interrupt the first etching, then implement the second etching.

The person skilled in the art will be able to determine operating conditions adapted for the materials and thicknesses of his application. Thus, he will be able to determine the SixCly or SixFy content in the mixture as well as the etching time.

As illustrated in FIG. 3D, after the first etching, a second etching is carried out.

The first and second etchings, and optionally the preliminary etching, are preferably carried out in the same etching equipment, for example of the inductively coupled plasma (ICP) reactor or capacitively coupled plasma (CCP) reactor type. The first and second etchings can thus be carried out cyclically in situ in the same reactor.

The first etching can be extended at the start of the second etching, for a time called overetch time, or "(OE)" according to current terminology.

The second etching aims at completely removing the second protective layer 60 located on the upper part of the lateral portion 14f of the dielectric layer covering the flank 32 while retaining a portion 50b of thickness e50b of the first protective layer on the top 31 of the Fin 30.

This purpose is all the more easily achieved when the thickness e50a of the first protective layer 50a is thicker than the thickness e60a of the second protective layer 60.

Moreover, during this step, a portion 51b of the thickness e51b of the third protective layer formed above the insulating layer 12 is also retained.

The second etching may also slightly consume the dielectric material of the lateral portion 14f, after removal of the second protective layer 60. This consumption is nevertheless less significant than during the first etching. This is not the main purpose of this second etching.

This second etching also aims at modifying the dielectric material of the lateral portion 14f. Thus, the species implanted during this second etching typically modify a portion 14m of the lateral portion 14f, over a depth d14m comprised between a few nanometres and a few tens of nanometres, typically between 5 nm and 10 nm. This modification of the dielectric material advantageously allows, during the repetition of the first etching in a following sequence, to slow down the formation of the second protective layer. The blocking of etching due to the formation of this second protective layer then occurs later. The etching of the modified dielectric layer is then more effective. In particular, the new first etching following this second etching may last longer. The thickness of the first and/or third oxide-based protective layers formed during this new first etching is then greater. The protection of the top of the Fin and/or of the insulating layer is thus improved. Thus, the second etching significantly improves the effects of the first etching which follows said second etching, called the first subsequent etching, in comparison with the first initial etching. The second etching allows the first subsequent etching to form one of the thicker protective layers on the top of the Fin and/or on the insulating layer while consuming a greater dielectric layer lateral portion height.

The species implanted during this second etching can also modify a portion 50m of the first protective layer, to a depth d50m of the order of a few nanometres. The species implanted during this second etching can also modify a portion 51m of the third protective layer, to a depth d51m of the order of a few nanometres.

The second etching is anisotropic, directed mainly along z. It is carried out by plasma from a chemistry comprising a source of hydrogen, for example H2 or NH3. Preferably, this plasma chemistry also comprises at least one additional diluting or dissociating species such as helium (He) or nitrogen (N). The dissociation gas is typically chemically inert with respect to the dielectric material, so as to avoid excessive consumption of dielectric material during this second etching. The flow rate of H2 or NH3 can be comprised between 10 and 200 sccm. The dissociation gas flow rate can be comprised between 0 and 500 sccm. The plasma can be continuous or pulsed the frequency of pulsed plasma according to a frequency preferably comprised between 200 Hz and 5 kHz, with an activation rate of 10% to 90%. Such a pulsed plasma allows to reduce the energy of the hydrogen-based ions. The pressure in the reactor can be comprised between 5 milliTorr and 100 milliTorr. The power of the plasma source can be comprised between 0 and 2000 W. The bias voltage can be comprised between 20 V and 500 V. The temperature of the support substrate can be comprised between 10° C. and 100° C. The etching time of this second etching can be of the order of a few seconds to a few hundred seconds. These conditions can be adapted according to the targeted applications and the height of dielectric material to be etched.

Figure 6:
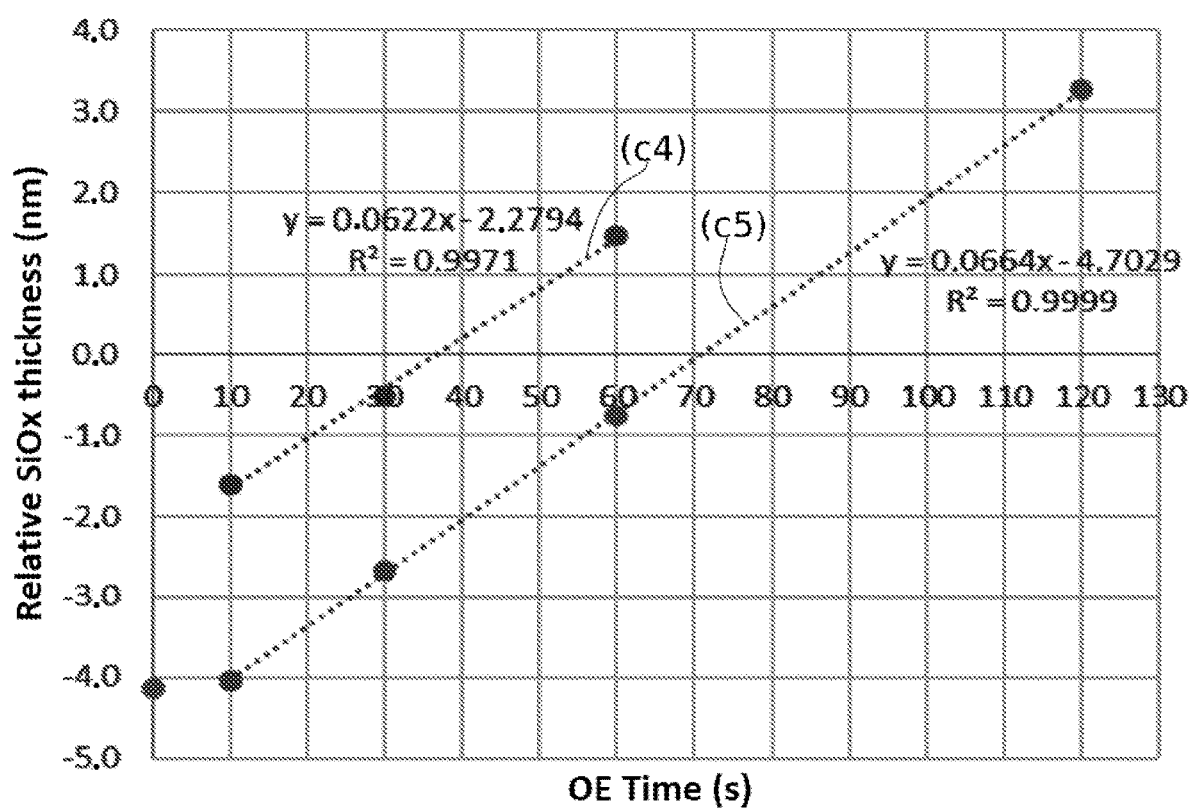
FIG. 6 is a graph illustrating the consumption of the oxide-based protective layer as a function of time, for different hydrogen-based plasma conditions.

FIG. 6 illustrates sputtered SiO2 thickness as a function of time, for different H2 plasma bias voltages. The curves (c4) and (c5) are plotted here respectively for a bias voltage of 150V and 250V, under overetch conditions of 2 sccm of flow rate of SiCl4. It appears that a bias voltage of 250V of the H2 plasma (with or without overetch) can cause an oxide sputtering to a depth of 4 nm. To limit this sputtering phenomenon, it will be preferable to choose a bias voltage less than 250 V, and preferably less than 150 V.

According to one example, the conditions of the second etching are as follows: the plasma is formed from H2 having a flow rate of 100 sccm. The power of the source is 500 W and the bias voltage is less than 150 V, for example 100 V. The pressure is 10 milliTorr. The temperature of the support substrate is 60° C. The etching time is 30 s.

This second etching step is interrupted, for example at the time, before all the first protective layer 50b is consumed.

As illustrated in FIGS. 3E, 3F, then 3G, 3H, the first and second etchings are repeated alternately.

According to a principle of the invention, the second etching increases the efficiency of the first etching which follows said second etching, in the sequence of steps of first and second etchings. In particular, the etching rate of SiN modified by hydrogen implantation is higher than the etching rate of unmodified SiN, under the etching conditions of the first etching. The formation of the second protective layer on the modified SiN is further delayed during the first etching. This allows to increase the duration of the first etching before an etching blockage occurs due to said second protective layer. The formation of the first protective layer on the modified SiOx is moreover favoured during the first etching. This increases the thickness of the first protective layer.

The SiN of the lateral portion of the dielectric layer on the flank of the Fin can thus be etched more quickly while improving the protection of the top of the Fin.

Throughout each sequence, the top 31 of the Fin 30 remains protected by the first protective layer 50a, 50b formed during the first etching step of each sequence. It is the same for the upper face 120 of the insulating layer 12 which remains protected by the protective layer 60a, 60b. During each first etching, the lateral portion 14f of the dielectric layer 14 covering the flank 32 of the Fin 30 has in turn been heavily consumed.

As illustrated in FIG. 3E, at the end of the second etching, a new first etching is carried out. It is seen in this FIG. 3E that the height e30 of the Fin 30 has not been consumed and that the top 31 of the Fin 30 is still covered by a protective layer 50a. The lateral portion 14f of the dielectric layer 14 covering the flank 32 of the Fin 30 has meanwhile been significantly consumed.

As illustrated in FIG. 3F, after the new first etching, a new second etching is carried out. It can be seen in this FIG. 3F that the top 31 of the Fin 30 is still covered by a protective layer 50b, while the second protective layer 60 has been removed on the lateral portion 14f. A portion 14m of the lateral portion 14f has further been modified by implantation of hydrogen-based species.

As illustrated in FIGS. 3G, 3H, additional sequences of first and second etchings can be carried out so as to consume the entire height of the lateral portion 14f.

FIG. 3I illustrates the result obtained when the etching of SiN is stopped at the end of a first etching step after having repeated the sequence of steps. As illustrated, the portion 14f of the dielectric layer 14 covering the flank 32 of the Fin 30 is completely consumed. On the other hand, the height e30 of the Fin 30 was not consumed. The top 31 of the Fin 30 is always covered by an oxide protective layer 50a. The upper face 120 of the insulating layer 12 can be covered by a protective oxide layer 60b, 51a, which is not necessarily uniform in thickness.

The protective layers 50a, 51a, 50b, 51b, 60b can then be removed. For this purpose, it is possible, for example, to carry out a removal by a wet method, for example by using an HF (hydrofluoric acid) bath. Depending on the case, it is possible for the insulating layer 12 to be slightly consumed. In general, the oxide-based protective layers formed have a low density and will be etched faster than the BOX-type oxide of the insulating layer. The protective layers based on modified oxide are advantageously etched much faster than the BOX-type oxide. Thus, the consumption of the BOX-type oxide of the insulating layer remains very low, or even non-existent.

Figure 3J:
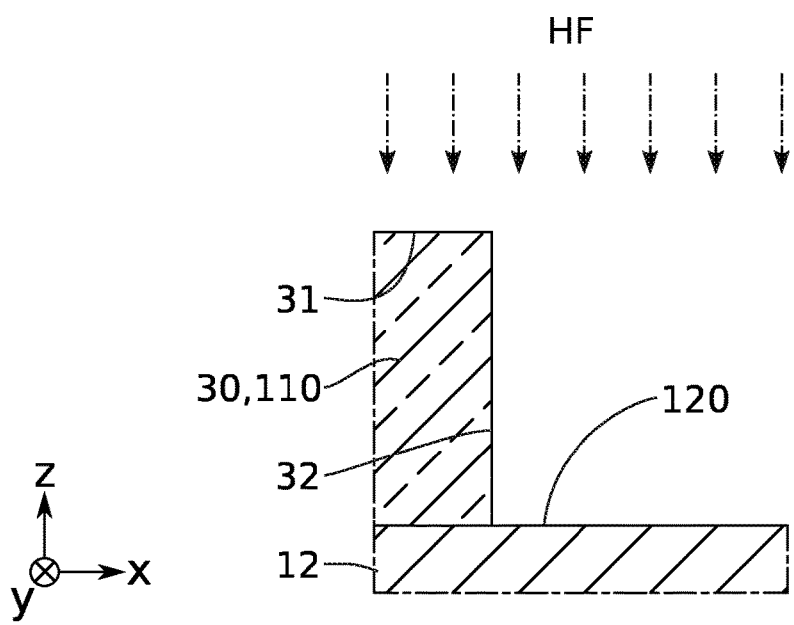

FIG. 3J illustrates the result obtained after removal of the protective layers. The portion 14f of the dielectric layer 14 covering the flank 32 of the Fin 30 has been entirely consumed, while the height e30 of the Fin 30 has not been consumed.

Optionally, before etching the dielectric layer 14, that is to say before the preliminary step if it is carried out or before the first sequence comprising the first and second etchings, it is possible to carry out a step of protecting the flanks 33 of the dielectric layer 14 (FIG. 3A). Indeed, during the various etchings, it is sought to etch the dielectric layer 14 along a direction Z perpendicular to the plane XY of the substrate 10. Thus, it may be advantageous to limit the lateral consumption (along the axis X) of the dielectric layer 14. For this purpose, it is possible to form, preferably by oxidation, a lateral protective layer on the dielectric layer 14.

In the case of the production of a FinFET transistor, it is desired to keep the portion 14g of the dielectric layer 14 on the flanks of the gate 130 while completely removing the portions 14b, 14f of the dielectric layer 14 on the Fins 30 (FIGS. 1, 2). However, the flanks of the gate 130 and the flanks 32 of the Fin 30 are generally perpendicular to the main plane XY of the support substrate 10 and are generally parallel to the main direction Z of implantation of the ions resulting from the plasma. In order to avoid consuming the dielectric layer on the flanks of the gate 130 during the removal of this same layer on the flanks of the Fins 30, it is provided that the thickness e150 of the hard mask 150 surmounting the gate 130 is greater than or equal to the thickness e30 of the Fin 30. Thus, when the lateral portions 14f of the dielectric layer 14 covering the flanks 32 of the Fin 30 will be entirely consumed, the dielectric layer 14 will have been consumed over at least part of the thickness of the hard mask 150 but will continue to completely cover the flanks of the gate 130.

In view of the foregoing description, it clearly appears that the present invention proposes an effective solution for completely etching with great precision the dielectric layer on the top and the flanks of a 3D structure while avoiding damage to this 3D structure. Typically, the etching of the dielectric layer is done with atomic precision or close to the etched monolayer.

The invention is not limited to the embodiments previously described.

For example, the method may not comprise a prior etching step. Thus, the etching of the dielectric layer is only operated by the sequences comprising the first and second etchings.

Although it finds a particularly advantageous application in the production of FinFET type transistors, the invention applies to all etchings of a dielectric layer on a three-dimensional structure. Thus, its application will be the production of transistors based on nanowires, in particular based on stacked nanowires.

The invention claimed is:

1. A method for etching a dielectric layer covering at least one top and one flank of a three-dimensional structure, said method comprising a plurality of sequences each comprising at least the following successive steps:
  a first etching of the dielectric layer, by plasma, using a chemistry comprising:
    at least a first fluorine based compound originating from the dissociation of at least one compound taken from the fluorocarbon compounds $C_xF_z$ or $C_xH_yF_z$, x, y and z being non-zero integers, and
    at least a second compound taken from $Si_wCl_{(2w+2)}$ and $Si_wF_{(2w+2)}$, with w being a non-zero integer, oxygen,
  said first etching being carried out in such a way as to:
  generate an ion bombardment directed mainly in a direction parallel to said flank,
  regulate the amount of at least a first compound to consume all of said first fluorine-based compound during said first etching so as to interrupt the first etching before consumption of the entire thickness of the dielectric layer located on the flank and after having consumed the entire thickness of the dielectric layer located on the top,
  forming a first oxide-based protective layer on the top of the three-dimensional structure and forming a second oxide-based protective layer on the dielectric layer located on the flank, a thickness e50a of the first protective layer being greater than a thickness e60a of the second protective layer,
  a second etching configured to completely remove the second protective layer while retaining a portion of thickness e50b of the first protective layer,
  said sequence of first and second etchings being repeated until completely removing the dielectric layer located on the flank of the three-dimensional structure,
  wherein the second etching is carried out by hydrogen-based plasma, and
  wherein the hydrogen-based plasma is fluorine-free and is $NH_3$ or $H_2$ plasma.

2. The method according to claim 1, wherein the second etching is configured to modify an upper portion of the dielectric layer located on the flank, by implantation of hydrogen-based species.

3. The method according to claim 1, wherein the plasma of the second etching is additionally formed from nitrogen or helium.

4. The method according to claim 1, wherein the plasma of the second etching is anisotropic along the direction parallel to the flank of the structure.

5. The method according to claim 1, comprising a sequence of first and second initial etchings, and wherein, during the repetition of a sequence of first and second subsequent etchings, the first subsequent etching has a duration greater than that of the first initial etching.

6. The method according to claim 1, wherein the first etching is configured so that the first oxide-based protective layer formed has a thickness e50a greater than or equal to 5 nm.

7. The method according to claim 1, wherein the second etching is configured so that the portion of the first protective layer retained has a thickness e50b greater than or equal to 2 nm.

8. The method according to claim 1, comprising a preliminary step of etching the dielectric layer, carried out before said sequence of steps, the preliminary etching step being interrupted so as to retain a portion of the dielectric layer located on the top of the three-dimensional structure.

9. The method according to claim 1, wherein the second oxide-based protective layer is formed on an upper portion of the dielectric layer located on the flank.

10. The method according to claim 1, comprising a preliminary step of oxidation of the dielectric layer, carried out before said sequence of steps, the preliminary oxidation step being intended to limit lateral etching of the dielectric layer during the first etching.

11. The method according to claim 1, wherein the structure is made of a semiconductor material and forms a channel of a FinFET transistor.

12. The method according to claim 1, wherein the hydrogen-based plasma is $NH_3$ plasma.

13. The method according to claim 1, wherein the hydrogen-based plasma has a bias voltage of 150 V to less than 250 V.

14. A method for producing a FinFET transistor surmounting a support substrate, the FinFET transistor comprising a gate and at least one channel passing through the gate and extending from a flank of the gate to form at least one structure made of a semiconductor material, said structure having a top and at least two flanks, the method comprising:
the deposition of a dielectric layer covering the gate and said structure,
the etching of the dielectric layer by implementing the method according to claim 1, so as to completely remove the dielectric layer located on the structure formed by the channel.

15. The method according to claim 14, wherein the transistor has a hard mask covering a top of the gate, the dielectric layer being deposited on the hard mask, the hard mask having a thickness e150, such that e150≥e30, e30 being the height of the structure.

* * * * *